(12) United States Patent
Seyama et al.

(10) Patent No.: US 6,801,413 B2
(45) Date of Patent: Oct. 5, 2004

(54) MAGNETIC SENSOR, MAGNETIC HEAD AND MAGNETIC RECORDING APPARATUS

(75) Inventors: Yoshihiko Seyama, Kawasaki (JP); Keiichi Nagasaka, Kawasaki (JP); Yutaka Shimizu, Kawasaki (JP); Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 327 days.

(21) Appl. No.: 10/106,412

(22) Filed: Mar. 26, 2002

(65) Prior Publication Data
US 2003/0039083 A1 Feb. 27, 2003

(30) Foreign Application Priority Data
Aug. 10, 2001 (JP) ........................................ 2001-243187

(51) Int. Cl.$^7$ ............................................. G11B 5/127
(52) U.S. Cl. ................................................ 360/324.12
(58) Field of Search ........................ 360/324.12, 324.2, 360/324.1, 324.11, 324, 319; 29/603.1; 324/252

(56) References Cited

U.S. PATENT DOCUMENTS

| | | | |
|---|---|---|---|
| 5,668,688 A | 9/1997 | Dykes et al. | |
| 5,793,576 A | 8/1998 | Gill | |
| 6,064,552 A | 5/2000 | Iwasaki et al. | |
| 6,097,578 A | * 8/2000 | Pokhil | 360/319 |
| 6,198,609 B1 | 3/2001 | Barr et al. | 360/322 |
| 6,249,407 B1 | 6/2001 | Aoshima et al. | 360/324.2 |
| 6,519,119 B1 | * 2/2003 | van der Heijden et al. | 360/324 |

FOREIGN PATENT DOCUMENTS

| | | |
|---|---|---|
| CN | 1196814 | 10/1998 |
| JP | 02116133 | 4/1990 |

* cited by examiner

Primary Examiner—Allen Cao
(74) Attorney, Agent, or Firm—Greer, Burns & Crain, Ltd.

(57) ABSTRACT

A magnetic sensor having such a structure that a hard layer for controlling the magnetic domain formed of a conductive hard magnetic material, and a magnetic sensor layer, are at least partially in direct contact with each other, and current flows in the direction wherein at least a main component of current is perpendicular to the surface of the magnetic sensor layer. The current flowing in the magnetic sensor layer and the hard layer is controlled by changing the resistivity of the hard layer. The magnetic sensor is used as a magnetic read head in a magnetic recording apparatus such as magnetic disk apparatus.

16 Claims, 11 Drawing Sheets

MAGNETIC SENSOR, MAGNETIC HEAD AND MAGNETIC RECORDING APPARATUS

BACKGROUND OF THE INVENTION

1. Field of the Invention

The present invention relates to a magnetic sensor and a magnetic head. More particularly, the present invention relates to a magnetic sensor, of a CPP (current perpendicular to plane) type, for supplying a current in the direction perpendicular to the surface of a magnetic sensor layer. The magnetic sensor is used in a reproduction head, i.e., a read head, of a magnetic recording apparatus such as a hard disk drive (HDD). The magnetic sensor is characterized in that the resistivity (specific resistance) of a hard layer, of a hard magnetic material, acting as a magnetic domain control layer is controlled. The present invention also relates to a magnetic recording apparatus using the magnetic sensor of the present invention.

2. Description of the Related Art

As is well known, a magnetic sensor is principally used as a magnetic head of the HDD, i.e., a recording apparatus of a computer. Up to several years ago, the magnetic head for HDD had a sensing means, for a magnetic field, based on an induction current generated in a coil.

In recent years, however, the demand for a higher density and a higher speed has led to magnetic heads being provided with magnetic sensors capable of sensing a magnetic field by itself. The sensor is a magnetic sensor utilizing the magnetoresistive (MR) effect. Currently, there is a tendency to use a magnetic head utilizing the giant magnetoresistive (GMR) effect.

With the progress toward a higher recording density in the HDD as described above, the recording area per bit has been reduced and also the magnetic field generated has been reduced. In fact, the recording density of an HDD now available on the commercial market is about 10 to 20 Gbit/in$^2$, and is increasing at a rate of doubling every year.

As it is necessary to respond to the above-described decreasing magnetic field range and to allow sensing of a very small change in the external magnetic field, at present, a magnetic head based on the spin valve GMR effect is widely used.

The magnetic sensor showing the spin valve GMR effect comprises a magnetic layer (pinned layer) with a fixed direction of magnetization and a magnetic layer (free layer) with a free direction of magnetization, and in the magnetic sensor, the electrical resistance can be changed by a variation in the angle between the directions of magnetization in these two magnetic layers. However, for this magnetic sensor, if a magnetic domain is contained in the free layer, it can generate Barkhausen noise, and therefore, to avoid the noise, the magnetic domain must be controlled. As a layer of a hard magnetic material (hard layer) is currently used as a magnetic domain control layer, an example of the magnetic sensor utilizing the spin valve GMR effect will be explained hereinafter with reference to FIGS. 1A and 1B.

FIG. 1A is a sectional view schematically showing a prior art magnetic sensor (SV-CIP element) utilizing the spin valve GMR effect, and FIG. 1B is an enlarged view of the dashed circle (section 1B) in FIG. 1A.

First, a lower magnetic shield layer 63 of a NiFe alloy or the like is formed, through a base layer 62 of $Al_2O_3$ or the like, on an $Al_2O_3$—TiC substrate 61 which is a body of a slider. A spin valve layer 65 is formed through a lower read gap layer 64 of $Al_2O_3$ or the like, and after patterning to a predetermined shape, a hard layer 66, made of a high coercive force layer of CoCrPt or the like, acting as a magnetic domain control layer, is formed on the two ends of the spin valve layer 65. Then, a conductive layer of W/Ti/Ta multilayer or the like is deposited to form a read electrode 67.

Next, an upper magnetic shield layer 69 of a NiFe alloy or the like is formed through an upper read gap layer 68 of $Al_2O_3$ or the like, thereby completing a basic configuration of a read head utilizing a spin valve element.

In this instance, the spin valve layer 65 is formed by depositing a base layer (underlayer) 70 of Ta having a thickness of 5 nm, a free layer 71 of NiFe having a thickness of 4 nm, a free layer 72 of CoFe having a thickness of 2.5 nm, an intermediate layer 73 of Cu having a thickness of 2.5 nm, a pinned layer 74 of CoFe having a thickness of 2.5 nm, a antiferromagnetic layer 75 of PdPtMn having a thickness of 25 nm and a cap layer 76 of Ta having a thickness of 5 nm, in this order, by a sputtering process while applying a magnetic field of 80 [Oe], for example.

For example, the composition of NiFe is $Ni_{81}Fe_{19}$, that of CoFe is $Co_{90}Fe_{10}$, and that of PdPtMn is $Pd_{31}Pt_{17}Mn_{52}$.

The illustrated magnetic sensor is of CIP (current in plane) type, in which, as shown by arrows, a current is supplied in parallel to the surface of the spin valve layer 65, i.e. the surface of the magnetic sensor layer. As the hard layer 66 is arranged under the read electrode 67, its resistivity has no substantial effect on the characteristic (GMR characteristic) of the magnetic sensor.

In the formation of the read gap layer, the thinnest material capable of providing an insulation such as $Al_2O_3$ or $SiO_2$ formed by CVD or the like is currently used. However, the minimum thickness of these materials is about 20 nm. Thus, in view of the fact that if the bit length becomes shorter, the thickness of the read gap layer cannot be reduced any further, the only possibility is to reduce the thickness of the magnetic sensor layer itself. However, apparently, the reduction in the thickness of the magnetic sensor layer is also restricted.

To avoid the above problems while satisfying the recording density of an HDD of not less than 80 Gbit/in$^2$, it is necessarily considered to use a spin valve element (SV-CPP element) or TMR (tunnel magnetoresistive) element based on a CPP (current perpendicular to plane) system in which a current is supplied in the direction (at least the direction containing a perpendicular component) perpendicular to the surface of the magnetic sensor layer, because these elements do not require a read gap layer.

An example of the prior art read head of CPP type will be explained hereinafter with reference to FIG. 2.

FIG. 2 is a sectional view schematically showing the prior art SV-CPP element. As illustrated, a lower electrode 82 of NiFe capable of also acting as a lower magnetic shield layer and a spin valve layer 83 are formed on an $Al_2O_3$—TiC substrate 81. The spin valve layer 83 is etched to a predetermined pattern, followed by the lift-off process. In the lift-off process, a hard layer 84 of CoCrPt or the like and an insulating layer 85 of $Al_2O_3$ or the like are formed, on which an NiFe upper electrode 86 of NiFe capable of also acting as an upper magnetic shield layer is formed.

As described above, with the SV-CPP element, a read gap layer is not required. Further, as the upper and lower electrodes can also act as a magnetic shield layer, a whole thickness of the element can be reduced as compared with the SV-CIP element described above.

In this magnetic sensor of a CPP type, however, there is a problem that since the hard layer 84 is in direct contact with the spin valve layer 83, the sense current can escape as shown by arrows in FIG. 2 to the hard layer 84, thereby causing a reduction in the GMR characteristic.

To prevent the reduction in the GMR characteristic, the following methods are conceived:

Method 1:

As shown in FIG. 3, an insulating layer 87 is inserted between the hard layer 84 and the spin valve layer 83 so that the hard layer 84 may not be in direct contact with the spin valve layer 83.

Method 2:

As shown in FIG. 4, the hard layer 84 and the spin valve layer 83 are in direct contact with each other. The current supplied to the hard layer 84, however, is reduced by applying the specific arrangement (overlay structure) of the upper electrode 86 of NiFe.

Method 3:

As shown in FIG. 5, a magnetic insulating material such as a ferrite is used as the hard layer 88.

Among these three methods, the method 1 is not suitable because the spin valve layer 83 and the hard layer 84 are spaced from each other, and thus the controllability of the magnetic domain is reduced.

The method 3 suffers from the problem that since the magnetic characteristic (Br: residual magnetization) of the magnetic insulating material is small, it cannot be practically carried out.

Further, the method 3 suffers from the following problems:

First, the portion of the upper NiFe electrode 86 in contact with the spin valve layer 83 is at the center of the spin valve layer 83, and therefore is required to be smaller than the width of the spin valve layer 83. In view of the requirement of a positioning accuracy, it is difficult to easily produce the sensor with a high yield.

Secondly, depending on the layer structure such as the spin valve layer of the magnetic sensor, a low-resistance layer such as an Au antioxidation layer or the like is essentially disposed as the uppermost layer of the magnetic sensor layer, thereby posing the problem that the current from the upper electrode terminal can expand so widely as to escape to the hard layer.

It is difficult to solve all of these problems at the same time. To prevent the sense current from escaping to the hard layer, for example, a more complicated layer structure is required in the sensor.

SUMMARY OF THE INVENTION

The inventors of this application noted that the magnetic sensor (SV-CPP element) described above with reference to FIG. 1 has a simple structure, and it will become possible to provide a spin valve element of CPP type or TMR (tunnel magnetoresistive element) having a simple structure, along with satisfactory characteristics, if the current can be prevented from escaping into the hard layer of the element.

That is, the present invention is directed to reduce the reactive current as a result of an increase in the resistivity of a hard layer which acts as the magnetic domain control layer in a CCP-type magnetic sensor having a simple configuration.

One object of the present invention is to provide a magnetic sensor, particularly a spin valve element of a CPP type or a TMR (tunnel magnetoresistive) element having a simplified layer structure, along with a high GMR characteristic, without suffering from the problem such as an escape of the sense current to the hard layer, reduction in the controllability of the magnetic domain, low Br value (residual magnetization) and difficulty in positioning of the layers.

Another object of the present invention is to provide a magnetic sensor which is useful as a reproduction head or read head in a higher recording density magnetic recording apparatus such as a hard disk drive (HDD).

Still another object of the present invention is to provide a compact and high performance reproduction head using the magnetic sensor of the present invention.

In addition, another object of the present invention is to provide a compact magnetic recording apparatus satisfying a higher recording density and other requirements.

These objects and other objects of the present invention will be easily understood from the following description concerning the preferred embodiments of the present invention.

In one aspect thereof, the present invention resides in a magnetic sensor having such a structure that a hard layer for controlling the magnetic domain, formed of a conductive hard magnetic material, and a magnetic sensor layer are at least partially in direct contact with each other, and current flows in the direction wherein at least a main component of current is perpendicular to the surface of the magnetic sensor layer, in which the current flowing in the magnetic sensor layer and the hard layer is controlled by changing the resistivity of the hard layer.

In another aspect thereof, the present invention resides in a magnetic sensor having such a structure that a hard layer for controlling the magnetic domain, composed of a conductive hard magnetic material, and a magnetic sensor layer, are arranged at least partially in contact with each other, and current flows in the direction wherein at least a main component of current perpendicular to the surface of the magnetic sensor layer, in which the hard layer has a multi-layer structure comprising a Co-based alloy and an insulating material of a non-solid solution.

Further, in another aspect thereof, the present invention resides in a magnetic head comprising a magnetic reproduction head (hereinafter, also referred to as "read head") mounted therein, in which the reproduction head comprises the magnetic sensor of the present invention.

Furthermore, in still another aspect thereof, the present invention resides in a magnetic recording apparatus which comprises, at least, a magnetic head, a magnetic recording medium, a mechanism for rotating the magnetic recording medium, an arm member for mounting the magnetic head and a mechanism for moving the magnetic head as a function of moving the arm member, in which the magnetic head comprises the magnetic sensor of the present invention as a reproduction head.

DESCRIPTION OF THE PREFERRED EMBODIMENTS

The present invention will be described hereinafter, with regard to its preferred embodiments, by referring to the accompanying drawings.

Figure 6:
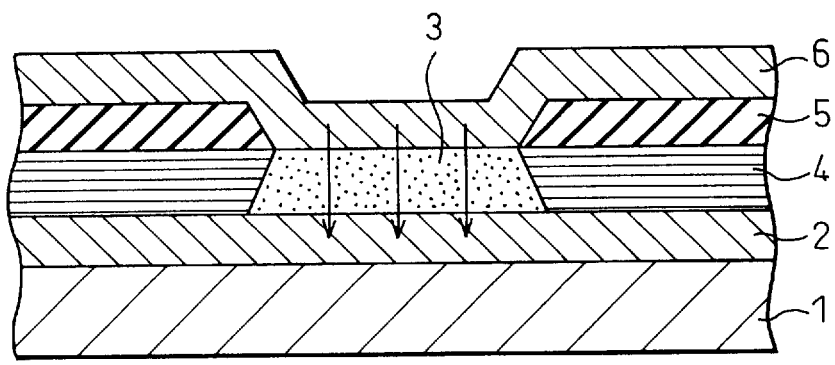
FIG. 6 is a cross-sectional view illustrating the basic structure of the magnetic head according to the present invention.

FIG. 6 is a cross-sectional view for explaining the basic concept of the present invention, and shows the essential constitutional parts of a CCP-type read head. In FIG. 6, reference numerals 1, 2, 5 and 6 designate a substrate, a lower electrode, an insulating layer and an upper electrode, respectively.

According to the present invention, to achieve the objects described above, there is provided a magnetic sensor having such a structure that a hard layer 4, composed of a conductive hard magnetic material, for controlling a magnetic domain and a magnetic sensor layer 3 are arranged at least in partial contact with each other and, as illustrated with arrows, at least a main component of a current is supplied in the direction perpendicular to the surface of the magnetic sensor layer 3. The magnetic sensor is characterized in that the current flowing in the magnetic sensor layer 3 and the hard layer 4 is controlled as a function of the change in the resistivity of the hard layer 4.

The magnetic sensor layer 3 used in the present invention, although not restricted thereto, includes a spin valve layer having a structure of an antiferromagnetic layer/pinned layer/intermediate layer/free layer, a dual spin valve layer, a spin valve layer having inserted into the structure thereof a pin hole-containing insulating layer (not functioning as an insulating material as a whole) such as an oxide, a carbide or a nitride or a tunnel magnetoresistive (TMR) layer.

In the CCP-type magnetic sensor, a reduction in the capability of the magnetic domain control can be prevented since the magnetic sensor layer 3 and the hard layer 3 are arranged in direct contact with each other, and also the current component flowing into the hard layer 4 can be reduced by controlling the resistivity of the conductive hard layer 4.

In this case, the resistivity of the hard layer 4 is preferably controlled to be not less than 80% of the highest resistivity obtainable in the materials constituting the magnetic sensor layer 3. For example, the hard layer 4 can be formed by a combination of a Co-based alloy such as CoCrPt or the like and an insulating material of a non-solid solution such as $SiO_2$ or the like, or a multilayer structure comprising a Co-based alloy such as CoCrPt or the like and an insulating material of non-solid solution such as $SiO_2$ or the like. As a result, the resistivity of the hard layer 4 can be increased above that of the Co-based alloy itself without extremely reducing the controllability of the magnetic domain of the hard layer 4.

In addition, a magnetic recording apparatus capable of high-density magnetic recording can be realized by mounting the above-described magnetic sensor as a magnetic read head, and especially by mounting the magnetic sensor with the magnetic recording device or mechanism.

Prior to explaining the SV-CPP element according to the first preferred embodiment of the present invention, a simulation method made to obtain the structure of the SV-CPP element according to preferred embodiments of the invention and a method of controlling the resistivity of the hard layer will be explained with reference to FIGS. 7 to 10.

Since the SV-CPP element is basically formed from a conductive metal alone, the resistivity thereof is in the same order as the normal metal as shown in Table 1.

TABLE 1

| Material | Resistivity ($\mu\Omega$cm) |
|---|---|
| Ta | 180 |
| PdPtMn | 200 |
| NiFe | 30 |
| CoFeB | 26 |
| Cu | 2 |
| Ru | 20 |

Therefore, it is considered that if the resistivity of the hard layer is large, almost all the current will flow through the magnetic sensor portion, and thus adverse effect on the GMR characteristic will be diminished.

Further, the SV-CPP element may have added thereto an insulating material layer such as an oxide layer, a carbide layer, a nitride layer or a borate layer. The insulating material layer, however, is used to reduce the effective area of the current path, and cannot act as an insulating layer itself because of the presence of pinholes.

In the SV-CPP element having the above structure, since the resistivity of the insulating material layer can be the largest among the magnetic sensor-constituting materials, it is considered that if the resistivity of the hard layer is larger than that of the insulating material layer, substantially all of the current will flow in the magnetic sensor portion and thus an adverse effect on the GMR characteristic will be negligibly reduced.

Figure 7:
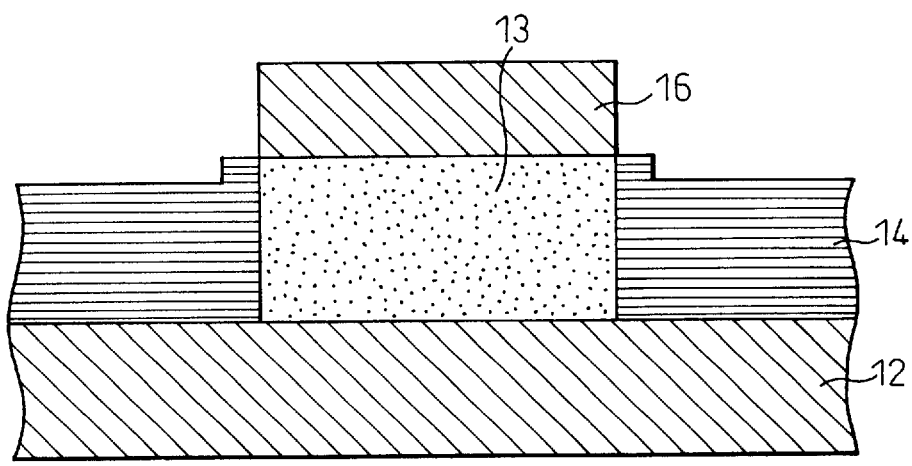
FIG. 7 is a cross-sectional view illustrating the structure of the SV-CPP element according to the present invention.

To ascertain the above facts, simulation was done by producing the SV-CPP element having the sectional structure as shown in FIG. 7. After the structure was separated into a plurality of mesh areas, the current distribution was simulated while changing the resistivity of the hard layer using a device simulator "B2Spice".

The simulation was done for two types of the spin valve layer 12, i.e., a spin valve layer, free of the oxide layer, formed by a conductive metal alone, and a spin valve layer having an oxide layer with an insulating material layer added thereto.

In the simulation, the spin valve layer formed from only a conductive metal was a dual spin valve layer having the structure: Ta (5 nm)/NiFe (2 nm)/PdPtMn (15 nm)/CoFeB (1.5 nm)/Ru (0.8 nm)/CoFeB (2.5 nm)/Cu (2.8 nm)/CoFeB (4 nm)/Cu (2.8 nm)/CoFeB (2.5 nm)/Ru (0.8 nm)/CoFeB (1.5 nm)/PdPtMn (15 nm)/Ta (5 nm). Further, the spin valve film with the added insulating material layer was an oxide layer-containing spin valve layer having the structure: Ta (5 nm)/NiFe (2 nm)/PdPtMn (15 nm)/CoFeB (1.5 nm)/Ru (0.8 nm)/CoFeB (1.2 nm)-oxide/CoFeB (1.5 nm)/Cu (2.8 nm)/CoFeB (2 nm)/Cu (2 nm) and Ta (1 nm)-oxide.

The simulation will be further described with reference to FIGS. 8 and 9.

Figure 8:
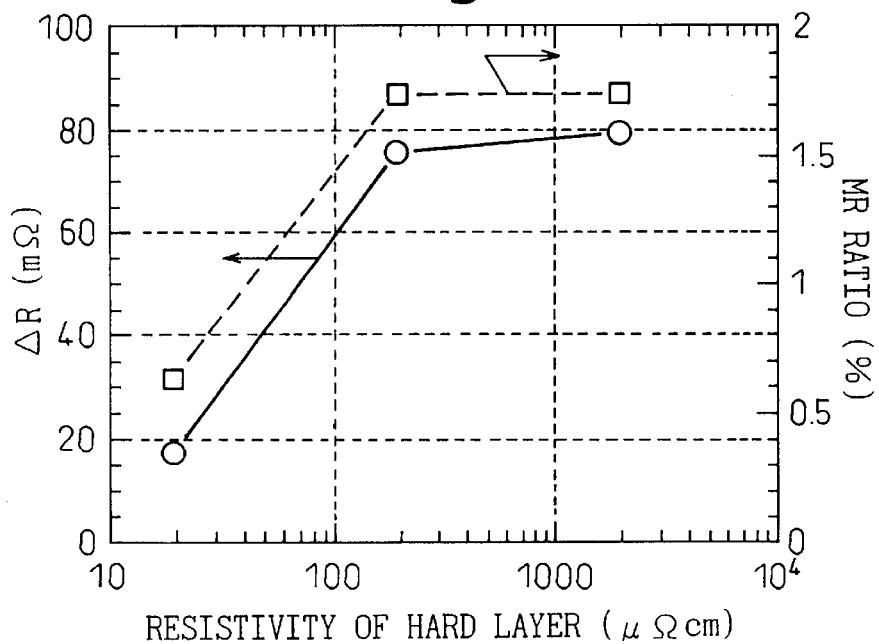
FIG. 8 is a graph showing a dependency on a resistivity of the hard layer, of ΔR and MR ratio of the SV-CPP element having no oxide layer.
Figure 9:
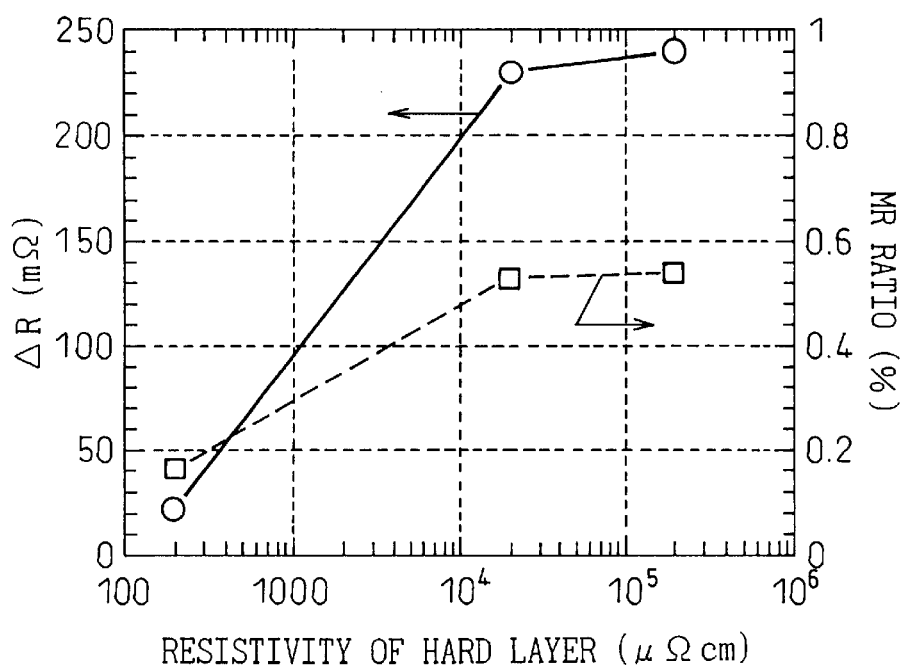
FIG. 9 is a graph showing a dependency on a resistivity of the hard layer, of ΔR and Mr ratio of the SV-CPP element having an oxide layer.

FIG. 8 is a graph showing the result of simulation of the hard layer resistivity dependence of ΔR and the MR ratio of the SV-CPP element free of an oxide layer, and FIG. 9 a graph showing the result of simulation of the hard layer resistivity dependence of ΔR and the MR ratio of the SV-CPP element having an oxide layer. For both SV-CPP elements, it is appreciated that the smaller the resistance of the hard layer 13, the smaller the MR ratio and ΔR.

Further, it is considered that if the resistance of the hard layer 13 is large and comparable to the maximum resistivity of the magnetic sensor materials shown in Table 1 above, the reduction in the MR ratio and ΔR is small and thus the SV-CPP elements can be used practically.

Especially, for the SV-CPP element having an oxide layer, the maximum resistivity of the magnetic sensor materials is equal to that of the inserted oxide layer having pinholes. That is, the resistivity of the oxide layer is 24000 $\mu\Omega$cm, the resistivity of the hard layer 13 is 20000 $\mu\Omega$cm, which is about 80% of the resistivity of the oxide layer. Nevertheless, since a reduction of ΔR is only 5.42%, it is considered that the hard layer 13 having such reduced resistivity is practically applicable to the SV-CPP element.

Further, the simulation results show that even in the case where the resistance of the hard layer is about 50% of the maximum resistivity of the magnetic sensor materials, the reduction of ΔR is 20 to 25%, and thus the hard layer having such reduced resistivity is practically applicable, as long as the value ΔR is large in the absence of a hard layer.

Furthermore, for the elements suffering from the problem of a large resistance such as the TMR element, the apparent resistance can be reduced by adding the hard layer. In such a case, although ΔR and the MR ratio can be reduced, such reduction can be controlled by controlling the resistivity of the hard layer.

Next, the resistance of the hard layer 13 was determined after the layer 13 was formed from a granular layer.

Figure 10:
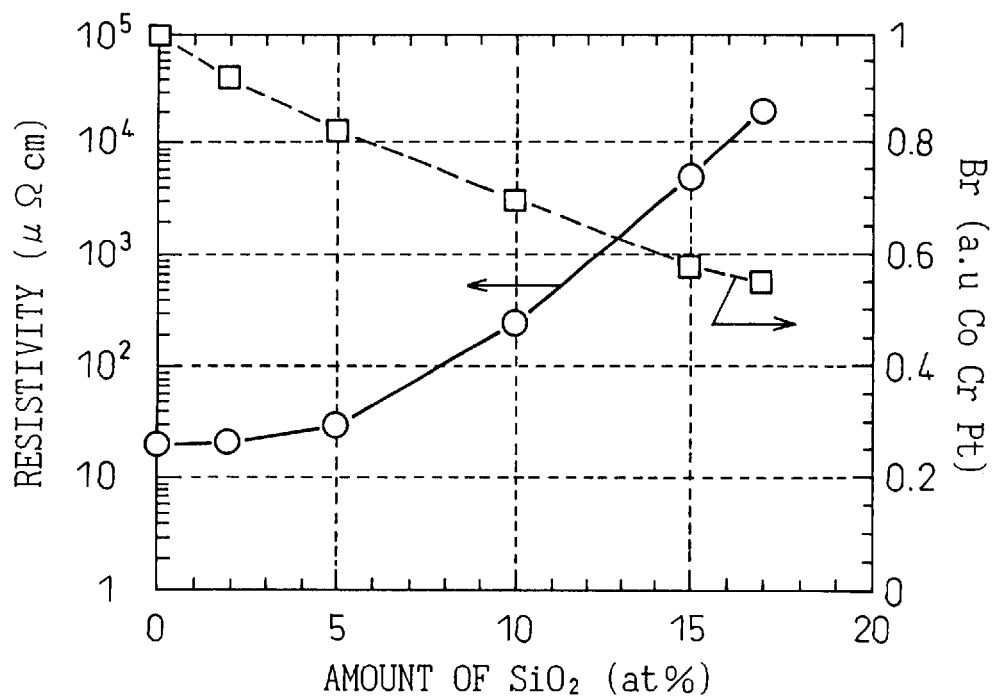
FIG. 10 is a graph showing a dependency on an amount of $SiO_2$, of resistivity and Br of the magnetic head.

FIG. 10 is a graph showing the $SiO_2$ amount (composition ratio) dependency of the resistivity and the residual magnetization Br, in the case where a $SiO_2$ chip is arranged on a CoCrPt target, a film is formed by sputtering on a $Si/SiO_2$ substrate, and the heat treatment is conducted for three hours at 280° C. to deposit $SiO_2$ in the CoCrPt grain boundary, thus forming a granular layer having a large resistivity.

As shown in FIG. 10, the resistivity is 250 $\mu\Omega$cm when the amount of $SiO_2$ in CoCrPt—$SiO_2$ is 10 atomic %, and 20,000 $\mu\Omega$cm at 17 atomic %. Each resistivity is at least equal to the maximum resistivity of 24000 $\mu\Omega$cm. Among the layers of the SV-CPP element, an oxide layer can show such maximum resistivity.

Figure 1A:
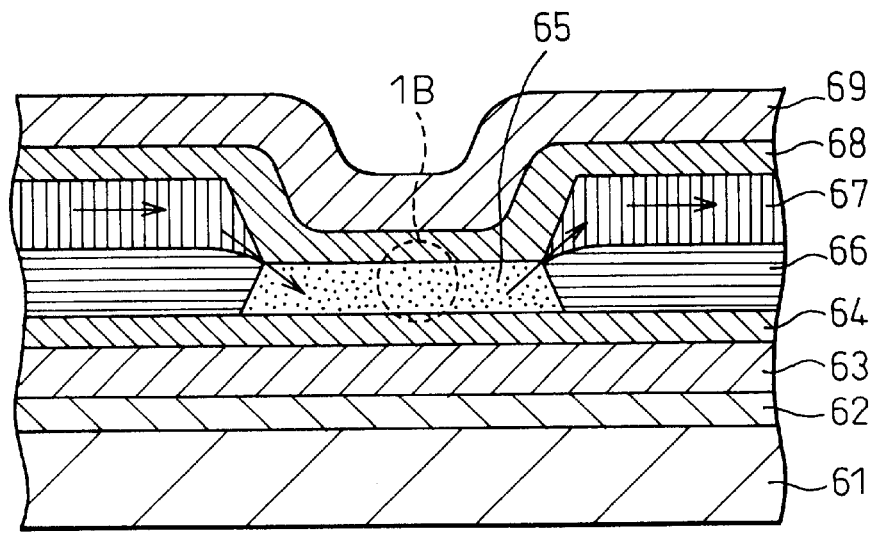
FIG. 1A is a cross-sectional view illustrating the structure of the prior art SV-CIP element.
Figure 1B:
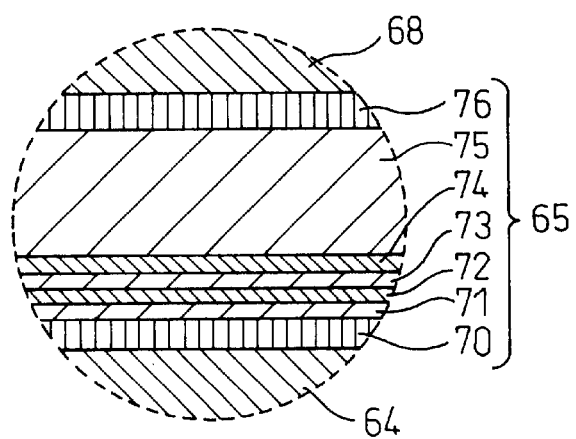
FIG. 1B is an enlarged cross-sectional view of the section IB of FIG. 1A.
Figure 2:
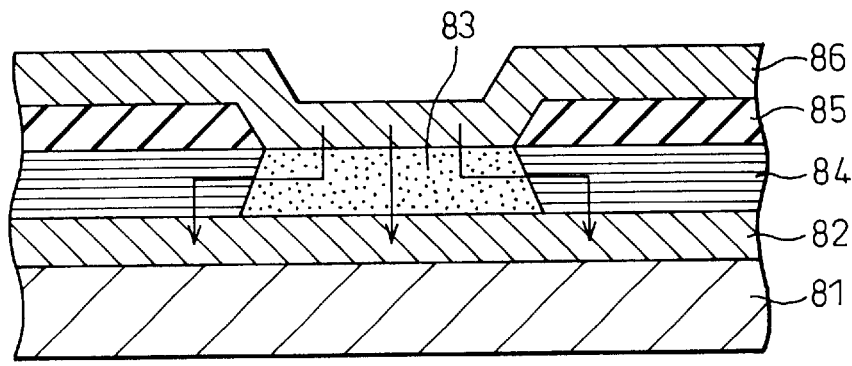
FIG. 2 is a cross-sectional view illustrating the structure of the prior art SV-CPP element.
Figure 3:
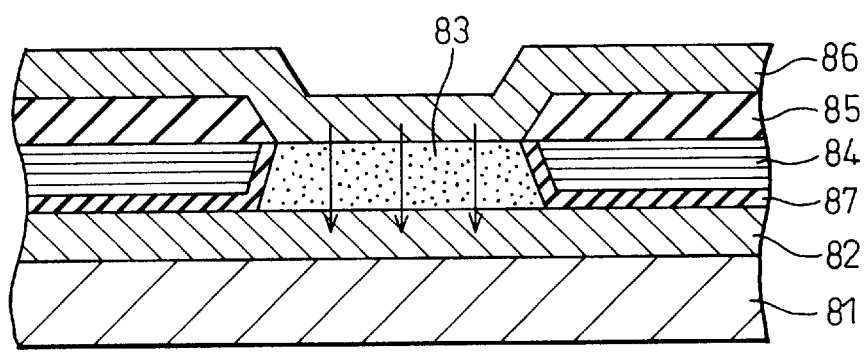
FIG. 3 is a cross-sectional view illustrating the structure of the prior art SV-CPP element with a reduced leakage current.
Figure 4:
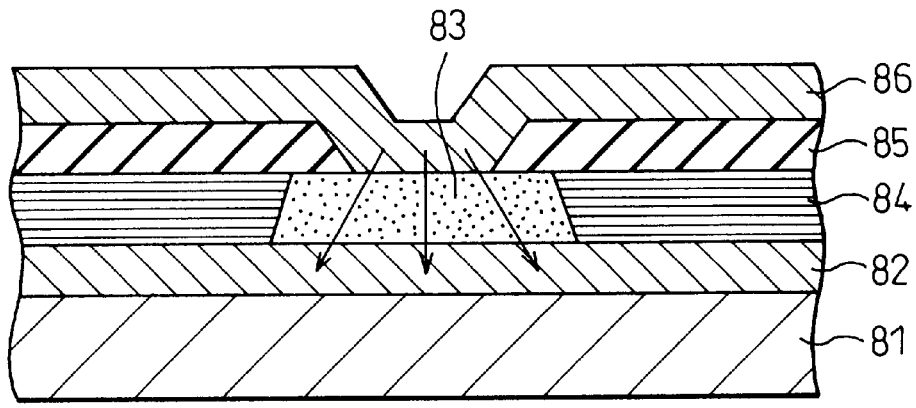
FIG. 4 is a cross-sectional view illustrating the structure of the prior art SV-CPP element of current constrictive type.
Figure 5:
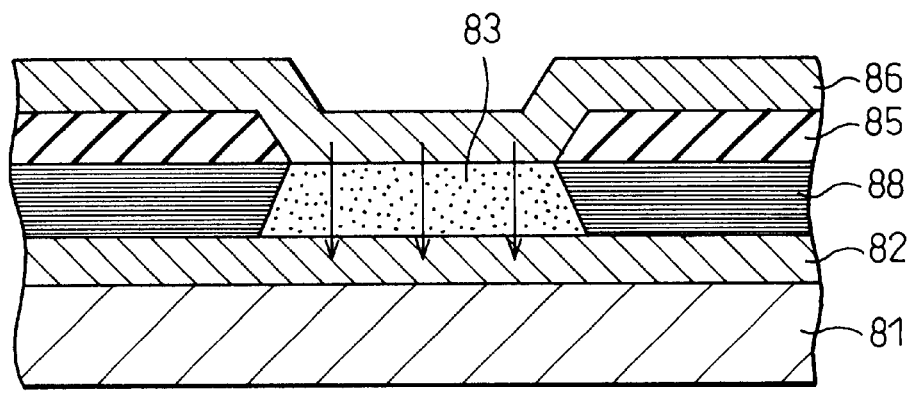
FIG. 5 is a cross-sectional view illustrating the structure of the prior art SV-CPP element using a hard layer of an insulating material.

As is apparent from the above, as long as the resistivity of the hard layer is at least equal to the maximum resistivity of the magnetic sensor materials, substantially all of the sense current can flow through the magnetic sensor portion even in the SV-CPP element having the structure of FIG. 2, and therefore reduction in the GMR characteristic can be diminished to a small level.

Based on the above results, a SV-CPP element with the added hard layer was produced, and its GMR characteristic was studied. For the comparison purpose, the SV-CPP element having no hard layer was produced, and its GMR characteristic was also studied.

Figure 11A:
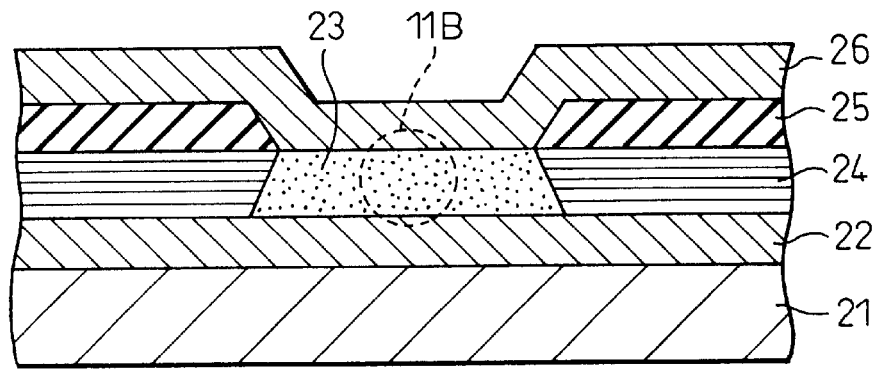
FIG. 11A is a cross-sectional view illustrating the structure of the SV-CPP element according to the first embodiment of the present invention.
Figure 11B:
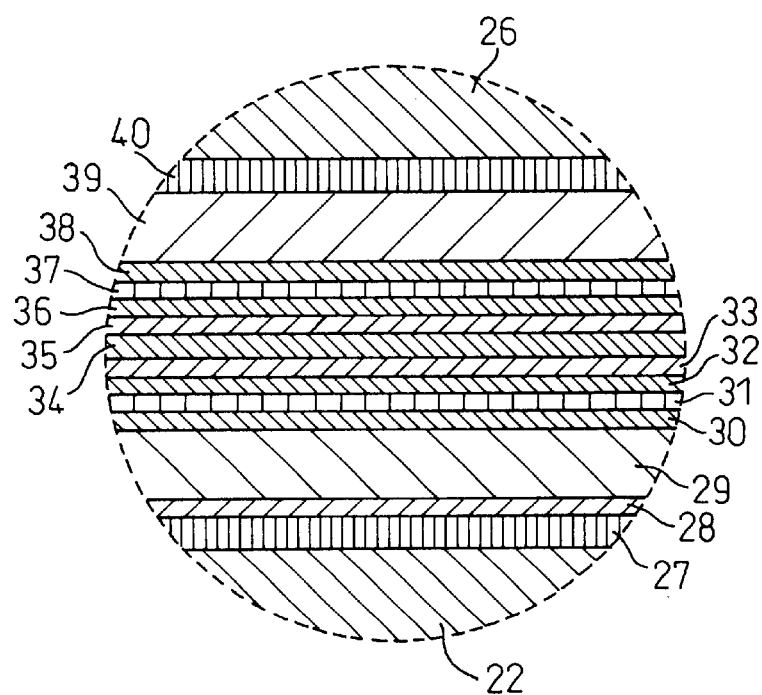
FIG. 11B is an enlarged cross-sectional view of the section 11B of FIG. 11A.

FIG. 11A is a cross-sectional view schematically showing the SV-CPP element according to the first preferred embodiment of the present invention, and FIG. 11B is an enlarged view showing the section 11B (dashed circle) of FIG. 11A.

First, a NiFe lower electrode 22 acting also as a lower magnetic shield layer and a dual spin valve layer 23 are formed on an $Al_2O_3$—TiC substrate 21 which is used as a body of the slider. After patterning to obtain a predetermined conficulation, a hard layer 24 to act as a magnetic domain control layer and an $Al_2O_3$ layer 25 for insulating the hard layer 24 from the upper electrode 26 of NiFe are formed at each of the ends of the dual spin valve layer 23 using a lift-off process. Finally, an upper electrode 26 of NiFe also acting as an upper magnetic shield layer is formed over an entire surface of the substrate 21. In this way, a basic structure of the SV-CPP element free of an oxide layer is completed.

In this SV-CPP element, the dual spin valve layer 23 is formed by sequentially depositing, through sputtering, a Ta underlayer 27 having a thickness of 5 nm, a NiFe underlayer 28 having a thickness of 2 nm, an antiferromagnetic layer 29 of PdPtMn having a thickness of 15 nm, a pinned layer of a laminated ferri structure consisting of a CoFeB layer 30 having a thickness of 1.5 nm, a Ru layer 31 having a thickness of 0.8 nm, and a CoFeB layer 32 having a thickness of 2.5 nm, a Cu intermediate layer 33 having a thickness of 2.8 nm, a free layer 34 of CoFeB having a thickness of 4 nm, a Cu intermediate layer 35 having a thickness of 2.8 nm, a pinned layer of a laminated ferri structure consisting of a CoFeB layer 36 having a thickness of 2.5 nm, a Ru layer 37 having a thickness of 0.8 nm, and a CoFeB layer 38 having a thickness of 1.5 nm, an antiferromagnetic layer 39 of PdPtMn having a thickness of 15 nm, and a Ta layer 40 having a thickness of 5 nm. Note that, in this embodiment, the composition of NiFe is $Ni_{81}Fe_{19}$, for example, the composition of CoFeB is $Co_{88}Fe_{10}B_2$, for example, and the composition of PdPtMn is $Pd_{31}Pt_{17}Mn_{52}$, for example.

Further, in this embodiment, the hard layer 24 is formed in such a manner that a $SiO_2$ chip is arranged on a CoCrPt target, and after forming a sputtered layer of an oversaturated solid solution containing $SiO_2$ at 10 atomic %, the heat treatment is conducted for three hours at 280° C. $SiO_2$ is deposited in the CoCrPt grain boundary, thereby producing a granular layer having a large resistivity. Note that the composition ratio of CoCrPt is $Co_{78}Cr_{10}Pt_{12}$, for example.

The following Table 2 shows the results of measurement of R, ΔR and the MR ratio in the SV-CPP element according to the above first embodiment. Table 2 also shows the results of the comparison example having no hard layer.

TABLE 2

| GMR characteristic | No hard layer | With hard layer | Change rate (%) due to addition of hard layer |
|---|---|---|---|
| R · A (Ω$\mu m^2$) | 0.131 | 0.129 | −1.53 |
| ΔR · A (mΩ$\mu m^2$) | 1.77 | 1.67 | −5.65 |
| MR ratio (%) | 1.35 | 1.29 | −4.19 |

In this table, character "A" of the left column designates the area of the upper surface of the dual spin valve layer 23.

As is apparent from Table 2, even in the case where the hard layer 24 is added, a reduction of the GMR characteristic is in an amount of not more than 10%. Further, no jump representing a Barkhausen noise is obvious in the MR curve. This means that the SV-CPP element causes no practical problem.

Further, it is considered that in this first embodiment, the Ta underlayer 27 and the Ta layer 40 positioned above and under the dual spin valve layer 23 can also act as a nonmagnetic metal layer to remove the magnetic connection between the upper or lower electrode layer and the dual spin valve layer 23.

Furthermore, in actual production of the magnetic sensor or the magnetic head, the lower electrode 22 of NiFe and the upper electrode 26 of NiFe are required to be patterned to obtain a terminal configuration.

Next, the SV-CPP element according to the second preferred embodiment of the present invention using a spin valve layer with an oxide layer will be explained with reference to FIGS. 12A and 12B, along with the comparative SV-CPP element having no hard layer. The GMR characteristic was also studied as in the first embodiment.

Figure 12A:
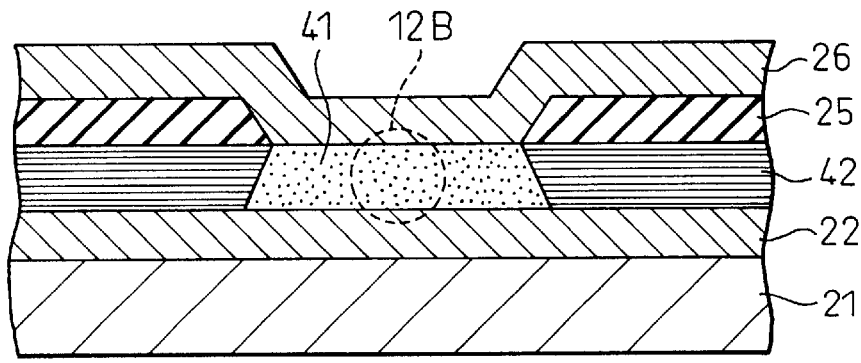
FIG. 12A is a cross-sectional view illustrating the structure of the SV-CPP element according to the second embodiment of the present invention.
Figure 12B:
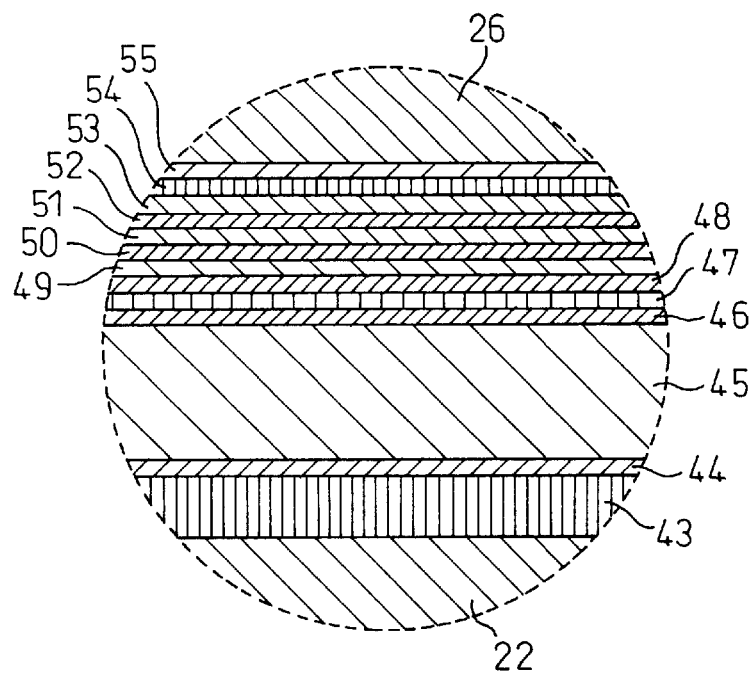
FIG. 12B is an enlarged cross-sectional view of the section 12B of FIG. 12A.

FIG. 12A is a cross-sectional view schematically showing the SV-CPP element according to the second embodiment of the present invention, and FIG. 12B is an enlarged view of the section 12B (dashed circle) of FIG. 12A.

First, a NiFe lower electrode 22 acting as a lower magnetic shield layer and a spin valve layer 41 are formed on an $Al_2O_3$—TiC substrate 21 which is used as a body of the slider. After patterning to obtain a predetermined configuration, a hard layer 42 acting as a magnetic domain control layer and an $Al_2O_3$ layer 25 are formed at each of the ends of the dual spin valve layer 41 using a lift-off process. Finally, an upper electrode 26 of NiFe also acting as an upper magnetic shield layer is formed over an entire surface of the substrate 21. In this way, a basic structure of the SV-CPP element having an oxide layer is completed.

In this SV-CPP element, the spin valve layer 41 is formed by sequentially depositing, through sputtering, a Ta underlayer 43 having a thickness of 5 nm, a NiFe underlayer 44 having a thickness of 2 nm, an antiferromagnetic layer 45 of PdPtMn having a thickness of 13 nm, and a pinned layer of a laminated ferrimagnetic structure consisting of a CoFeB layer 46 having a thickness of 1.5 nm, a Ru layer 47 having a thickness of 0.8 nm, and a CoFeB layer 48 having a thickness of 1.2 nm, followed by introducing $O_2$ into the sputtering device, so that the surface of the CoFeB layer 48 is oxidized at a depth of about 0.5 nm, for example, thereby to form an oxide layer 49.

Then, a CoFeB layer 50, a Cu intermediate layer 51 having a thickness of 2.8 nm, a free layer 52 of CoFeB having a thickness of 2 nm, a Cu layer 53 having a thickness of 2 nm and a Ta layer 54 having a thickness of 1 nm are sequentially deposited in this order. Thereafter, $O_2$ is again introduced into the sputtering device, so that the surface of the Ta layer 54 is slightly oxidized thereby to form an oxide layer 55.

In this embodiment, the oxide layer 49 and the oxide layer 55 have pinholes, through which a current flows.

Further, the composition of NiFe is $Ni_{88}Fe_{19}$, for example, the composition of CoFeB is $Co_{88}Fe_{10}B_2$, for example, and the composition of PdPtMn is $Pd_{31}Pt_{17}Mn_{52}$, for example.

Furthermore, the hard layer 42 is formed in such a manner that a $SiO_2$ chip is arranged on a CoCrPt target, and after forming a sputtered layer of an oversaturated solid solution containing $SiO_2$ at 17 atomic %, the heat treatment is conducted for three hours at 280° C. $SiO_2$ is deposited in the CoCrPt grain boundary, thereby producing a granular layer having a layer resistivity substantially equivalent to that of the oxide layer 49. Note that the composition ratio of CoCrPt is $Co_{78}Cr_{10}Pt_{12}$, for example.

The following Table 3 shows the results of measurement of R, ΔR and the MR ratio in the SV-CPP element according to the above second embodiment. Table 3 also shows the results of the comparison example having no hard layer.

TABLE 3

| GMR characteristic | No hard layer | With hard layer | Change rate (%) due to addition of hard layer |
|---|---|---|---|
| R · A (Ω$\mu cm^2$) | 1.12 | 1.08 | −3.57 |
| ΔR · A (mΩ$\mu m^2$) | 5.57 | 5.05 | −9.34 |
| MR ratio (%) | 0.50 | 0.47 | −5.98 |

In this table, character "A" of the left column designates the area of the upper surface of the spin valve layer 41.

As is apparent from Table 3, even in the case where the hard layer 42 is added to the SV-CPP element having an oxide layer, reduction of the GMR characteristic is in an amount of not more than 10%. Further, no jump representing a Barkhausen noise is obvious in the MR curve. This means that the SV-CPP element causes no practical problem.

Figure 13A:
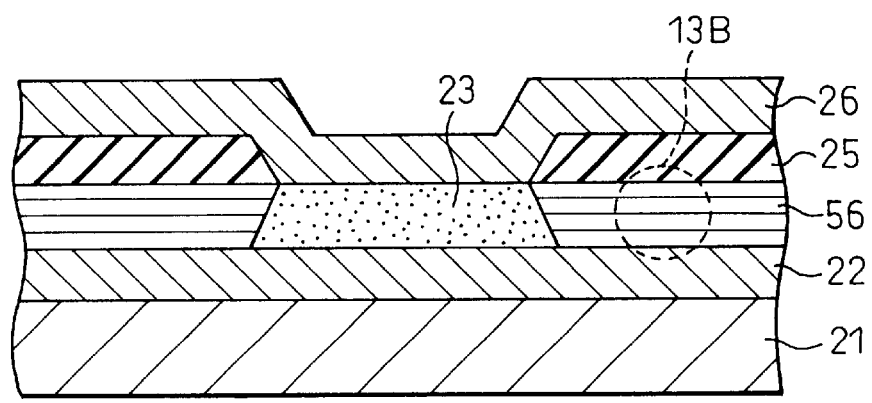
FIG. 13A is a cross-sectional view illustrating the structure of the SV-CPP element according to the third embodiment of the present invention.
Figure 13B:
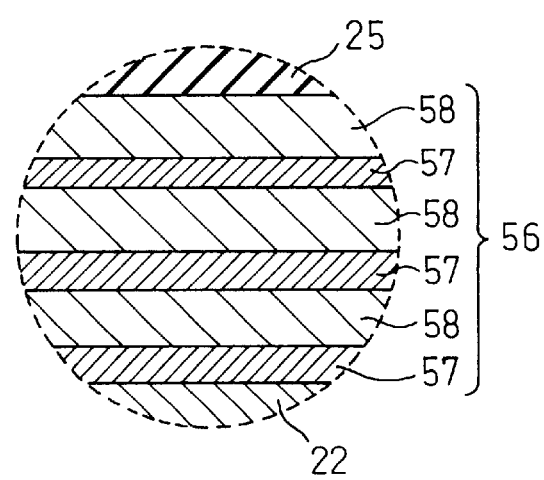
FIG. 13B is a enlarged cross-sectional view of the section 13B of FIG. 13A.

Now, the SV-CPP element according to the third preferred embodiment of the present invention will be explained with reference to FIGS. 13A and 13B, in which FIG. 13A is a cross-sectional view schematically showing the SV-CPP element and FIG. 13B is an enlarged view of the section 13B (dashed circle) of FIG. 13A.

First, a lower electrode 22 of NiFe acting as a lower magnetic shield layer and a dual spin valve layer 23 are formed on an $Al_2O_3$—TiC substrate 21 which is used as a body of the slider. After patterning to obtain a predetermined configuration, a hard layer 56 acting as a magnetic domain control layer and an $Al_2O_3$ layer 25 are formed at each end of the dual spin valve layer 23 using a lift-off process. Finally, an upper electrode 26 of NiFe also acting as an upper magnetic shield layer is formed over an entire surface of the substrate 21. In this way, a basic structure of the SV-CPP element having an oxide layer is completed.

In the SV-CPP element, the hard layer 56 has a multilayer structure and is produced using a CoCrPt target and a $SiO_2$ target. For example, three pairs of a $SiO_2$ layer 57 having a thickness of 5 nm and a CoCrPt layer 58 having a thickness of 10 nm are alternately deposited from their targets to form a multilayer structure film. Note in this hard layer 56, the composition of CoCrPt is $Co_{78}Cr_{10}Pt_{12}$, for example.

In the third embodiment described above, as the hard layer is composed of a multilayered layer of $CoCrPt/SiO_2$, the resistivity is as small as not more than 100 $\mu\Omega$cm in the case where a current flows parallel to the surface of the hard layer and substantially no current flows in the direction perpendicular to the layer surface, with the result that no sense current flows to the lower electrode 21 of NiFe from the hard layer. Therefore, similar results comparable to the first or second embodiment described above can be obtained.

Typical preferred embodiments of the present invention have been described above. Note, however, that the invention should not be limited to the structures described in the above embodiments, but various modifications may be carried out in the scope and spirit of the present invention.

For example, in the practice of the first embodiment, in place of a dual spin valve layer having a pinned layer of a laminated ferrimagnetic structure, a dual spin valve layer having a single pinned layer may be used as a magnetic sensor layer.

Further, although the oxide layer was formed by thermal oxidization in the second embodiment, the oxide layer may be formed upon deposition by sputtering or the like. Furthermore, in place of the oxide layer, other layers such as a carbide film, a nitride film or a borate film may be used with satisfactory effects.

Moreover, the magnetic sensor layer is not limited to a dual spin valve layer or an spin valve layer having an oxide layer. Alternatively, a single spin valve layer having no oxide layer may be used.

In addition, in the practice of the present invention, a tunnel magnetoresistive (TMR) film may be used in place of the spin valve layers, since they also exhibit the giant magnetoresistive effect.

When the tunnel magnetoresistive film is used, for example, the Cu intermediate layer in the aforementioned embodiments can be replaced with a tunnel insulating layer to obtain the magnetic sensor. The comparable effects can be obtained by controlling the resistivity of the hard layer.

In the above description concerning the first embodiment, the mixing ratio of $SiO_2$ in the hard layer 24 was controlled to be 10 atomic %, and in second embodiment, the mixing ratio of $SiO_2$ in the hard film 42 was controlled to be 17 atomic %. It should be noted that the mixing ratio of $SiO_2$ is not limited to these ratios, and it can be varied within the range ensuing the resistivity of not less than 80% of the largest resistivity of the materials constituting the magnetic sensor layer.

Further, the insulating material of a non-solid solution for granulation is not limited to $SiO_2$. Other non-solid insulating solutions such as $Al_2O_3$, SiN, etc. may be used, if necessary.

Furthermore, in the third embodiment described above, three pairs of hard layers were combined to form a multi-layer structure. However, the present invention should not be limited to the multilayer structure consisting of three pairs.

Similarly, the thickness ratio should not be limited to 1 (5 nm) to 2 (10 nm), described in the embodiment.

In the formation of the multilayer structure, the insulating layer for the hard layer should not be limited to the $SiO_2$ film. Other insulating layers such as $Al_2O_3$ layer, a SiN layer or the like may alternatively be used.

In each of the embodiments described above, the $Al_2O_3$ layer was used to insulate the hard layer from the upper electrode. An insulating layer of other materials such as $SiO_2$ may be used for the insulation purpose.

In each of the embodiments described above, a mild magnetic material, NiFe was used for the formation of upper and lower electrodes. Any other mild magnetic material such as FeN or Fe may be employed in place of NiFe.

Moreover, the upper and lower electrodes may not be formed from a mild magnetic material. For example, the electrodes may be formed from a non-magnetic and good conductive material such as Cu. In such a case, an upper magnetic shield layer and a lower magnetic shield layer have to be disposed on the outside of the upper and lower electrodes, respectively, resulting in an increase of a gap length.

In each of the above embodiments, the $Al_2O_3$—TiC substrate was used as a substrate, and the lower electrode of NiFe was disposed directly on the substrate. Alternatively, the lower electrode of NiFe may be formed after depositing an $Al_2O_3$ layer of about 2 $\mu$m thick by a sputtering process on an $Al_2O_3$—TiC substrate.

Further, CoCrPt was used as a hard magnetic material for the hard layer in the embodiments described above. Other Co-based alloys such as CoPt may be used as the hard magnetic material, if necessary.

In the embodiments described above, the present invention was described referring to a single magnetic sensor. However, the present invention should not be limited to the magnetic sensor used for a single read head but, of course, the present invention is applicable also to a magnetic sensor for a composite thin-film magnetic head comprising a laminated induction-type thin-film magnetic head for writing operation.

The present invention will be further described with regard to a magnetic disk device which is a typical example of the magnetic recording apparatus referring to FIGS. 14 to 17.

The magnetic disk device comprises, as essential constitutional means thereof:

a magnetic recording medium;

a mechanism for rotating the magnetic recording medium;

an arm member for mounting the magnetic head of the present invention, i.e., magnetic head comprising the magnetic sensor of the present invention; and a mechanism for moving the magnetic head as a function of movement of the arm member.

The magnetic recording medium, i.e., magnetic disk, used in the magnetic disk device is any one conventionally used in the field of magnetic recording, and may comprise a nonmagnetic substrate and a magnetic recording layer of a magnetic metal material applied through an underlayer on the substrate, and may have a variety of layer structures.

Figure 14:
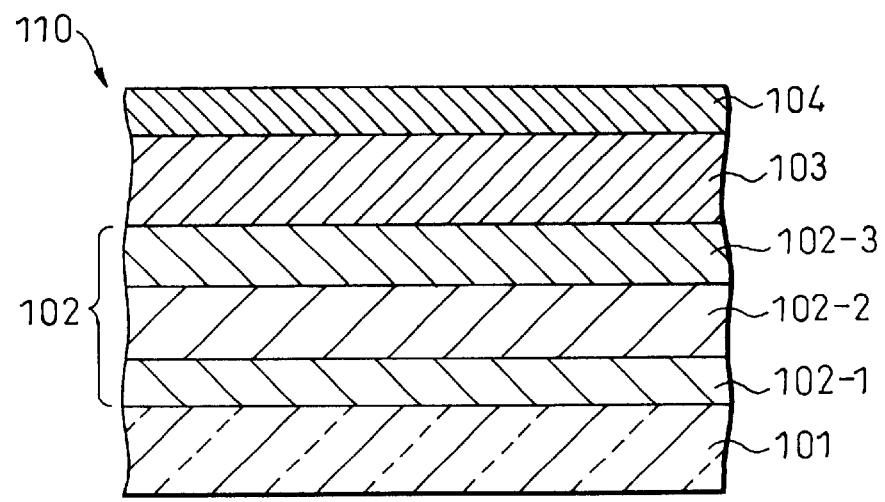
FIG. 14 is a cross-sectional view illustrating one preferred embodiment of the magnetic recording medium according to the present invention.

One simplified embodiment of the magnetic disk is illustrated in FIG. 14 in which a nonmagnetic recording medium 110 is so constituted that a magnetic recording layer 103 of a magnetic metal material is disposed through an underlayer 102 over a nonmagnetic substrate 101. The substrate 101 is a glass substrate, and its surface has non-oriented irregularities, i.e., recesses and protrusions. A silicon substrate or others may be used in place of the glass substrate.

In the illustrated magnetic disk 110, the underlayer 102 has a three-layered structure, and is constituted from a first underlayer 102-1 containing chromium as a principal component, a second underlayer 102-2 consisting of nickel and phosphorus (NiP) and a third underlayer 102-3 containing chromium as a principal component. In the three-layered structure, the first underlayer 102-1 can act as an adhesion-promoting layer and therefore it may be omitted from the underlayer, if such function is obtained in the absence of such an underlayer. Other underlayer structure may be applied, if desired.

The magnetic layer 103 has a direction of easy magnetization in its circumferential direction, and is made from an alloy which contains cobalt (Co) as a principal component, along with chromium (Cr) and platinum (Pt) as well as tantalum (Ta) or tantalum (Ta) and niobium (Nb). Of course, the magnetic layer 103 may be formed from other magnetic metals or it may be formed in other layer structures, if desired.

In the magnetic disk 110, a protective layer 104 is applied as an uppermost layer. The protective layer 104 is preferably formed from carbon or diamondlike carbon (DLC), for example. Further, the protective layer 104 is preferably impregnated with a lubricant such as fluorocarbon resin.

The structure of the magnetic disk device of the present invention is not limited to the particular one. Basically, however, the device comprises: a recording head section (write head) for recording information in a magnetic disk; and a reproducing head section (read head) for reproducing information. The reproducing head section is provided with the magnetic head of the present invention described above, i.e., an MR head using a magnetoresistor wherein the electric resistance changes in response to the magnetic field intensity.

In the magnetic disk device of the present invention, a composite magnetic head having the laminated structure in which a MR read head, for reading information from the magnetic disk, which comprises a magnetoresistor and a conductive layer for supplying a sense current into the magnetoresistor, and an induction type write head, for recording information on the magnetic disk, which has a pair of thin film electrodes, are laminated, can be preferably used. MR read heads include various structures known in the art and suitable examples thereof include AMR (anisotropic magnetoresistive) heads utilizing anisotropic magnetoresistance and GMR (giant magnetoresistive) heads utilizing giant magnetoresistance (including spin valve GMR head and the like).

The magnetic head of the present invention can be produced, for example, by simultaneously forming a plurality of the magnetic heads on a head substrate of the ceramic material in accordance with the conventional thin layer formation methods, followed by cutting the head substrate to obtain discrete magnetic heads and then fabricating each head to obtain a desired shape.

Figure 15:
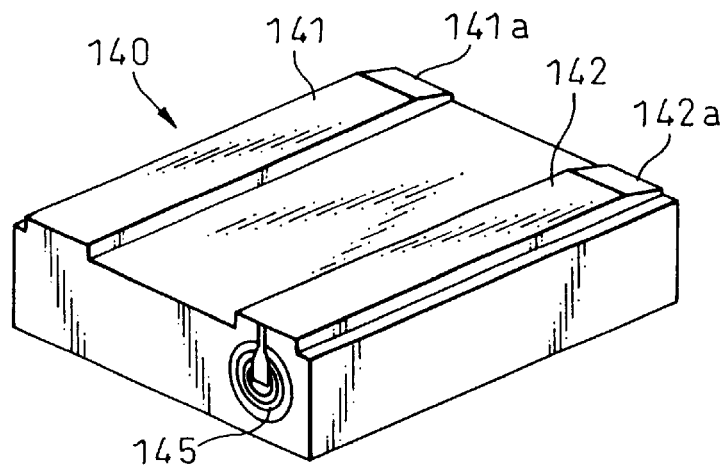
FIG. 15 is a perspective view of a slider provided with the magnetic head of the present invention.

FIG. 15 is a perspective view of a slider provided with a magnetic head, produced in accordance with the above process. In the slider shown in FIG. 15, rails 141 and 142 for creating a flying force are provided along the direction of an air stream created by the rotation of the magnetic disk (not shown) on the face, opposite to the magnetic disk, of the slider 140. Inclined faces 141a and 142a are formed on the air inflow side of the flying face of the rails 141 and 142, and the magnetic head 145 of the present invention is provided on the rear end face of the rail 142 in the slider 140. In the practice of the present invention, it is preferred to use a stiction-free slider, i.e., STF slider, in which the slider with a magnetic head is also provided with two or more protrusions on the flying face of the rails.

Figure 16:
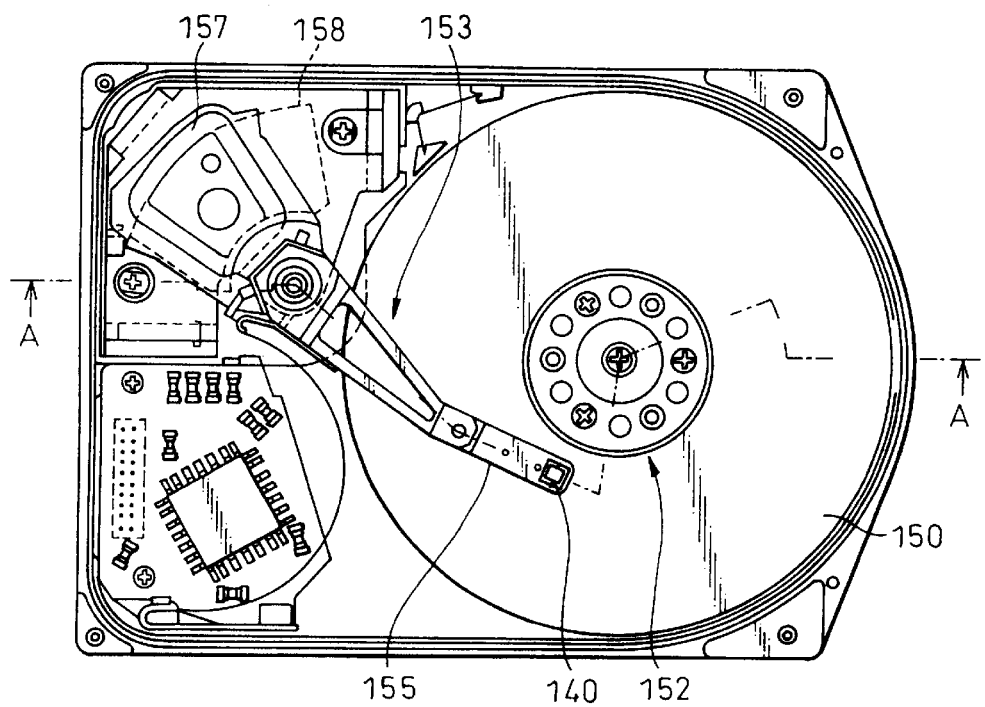
FIG. 16 is a plane view illustrating one preferred embodiment of the magnetic recording apparatus according to the present invention.
Figure 17:
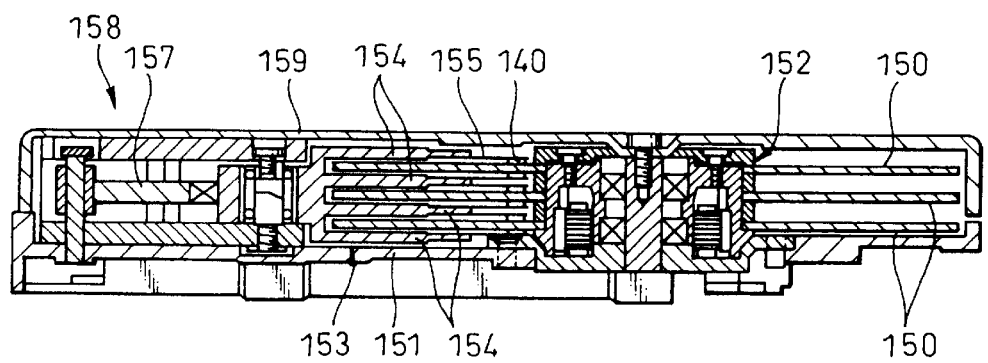
FIG. 17 is a cross-sectional view taken along line A—A of FIG. 16.

Further, FIGS. 16 and 17 illustrate one preferred embodiment of the magnetic disk device according to the present invention. FIG. 16 is a plane view of the magnetic disk device from which a cover was removed for the sake of understanding the structure, and FIG. 17 is a cross-sectional view taken along line A—A of FIG. 16.

In these drawings, reference numeral 150 designates a plurality of magnetic disks (three disks are contained for the present embodiment) which are rotated and driven by means of a spindle motor 152 provided on a base plate 151.

Reference numeral 153 designates an actuator rotatably provided on the base plate 151. A plurality of head arms 154, which extend toward the recording face of the magnetic disk 150 are provided on one rotation end of the actuator 153. A spring arm 155 is rotatably mounted on the rotation end of the head arm 154, and, further, the above-described slider 140 is inclinably mounted through an insulating layer (not shown) on the flexure section of the spring arm 155. On the other hand, a coil 157 is provided on the other rotation end of the actuator 153.

A magnetic circuit 158 constituted by a magnet and a yoke is provided on the base plate 151, and the coil 157 is disposed within the magnetic gap of the magnetic circuit 158. The magnetic circuit 158 and the coil 157 constitute a moving coil type linear motor (VCM: voice coil motor). The upper surface of the base plate 151 is covered with a cover 159.

The operation of the magnetic disk device having the above constitution will be described. When the magnetic disk 150 is in a stopped state, the slider 140 is in contact with a siding zone and in a stopped state.

When the magnetic disk 150 is rotated and driven at a high speed by means of a spindle motor 152, an air stream created by the rotation of the magnetic disk 150 permits the slider 140 to fly above the disk face while leaving a very small space between the slider and the disk surface. In this state, application of a current to the coil 157 creates thrust in the coil 157, thus rotating the actuator 153. This permits the head (slider 140) to be moved to a desired track of the magnetic disk 150 to conduct reading/wiring of data.

According to the present invention, the read head of CPP type is constituted in such a manner that the resistivity of the hard layer acting as a magnetic domain control layer is adjusted with respect to the resistivity of the magnetic sensor layer. Therefore, the sense current flowing in the hard layer can be remarkably reduced, and thus the reduction in the GMR characteristic can be suppressed, thereby greatly contributing to the realization and widespread use of the HDD having a high recording density.

What is claimed is:

1. A magnetic sensor having such a structure that a hard layer for controlling the magnetic domain, formed of a conductive hard magnetic material, and a magnetic sensor layer, are at least partially in direct contact with each other, and current flows in the direction wherein at least a main component of current is perpendicular to the surface of the magnetic sensor layer, in which the current flowing in the magnetic sensor layer and the hard layer is controlled by changing the resistivity of the hard layer.

2. A magnetic sensor as defined in claim 1, in which the resistivity of the hard layer is controlled to not less than 80% of the highest resistivity of any of the materials constituting the magnetic sensor layer.

3. A magnetic sensor as defined in claim 1 or 2, in which the hard layer comprises a combination of a Co-based alloy and an insulating material of a non-solid solution.

4. A magnetic sensor as defined in claim 3, in which the insulating material of a non-solid solution comprises $SiO_2$.

5. A magnetic sensor having such a structure that a hard layer, for controlling the magnetic domain and composed of a conductive hard magnetic material, and a magnetic sensor layer are arranged at least partially in contact with each other, and current flows in the direction wherein at least a main component of current is perpendicular to the surface of the magnetic sensor layer, in which the hard layer has a multilayer structure comprising a Co-based alloy and an insulating material of a non-solid solution.

6. A magnetic sensor as defined in claim 5, in which the insulating material of a non-solid solution comprises $SiO_2$.

7. A magnetic head comprising a magnetic read head mounted therein, in which the read head comprises a magnetic sensor, and the magnetic sensor has such a structure that a hard layer for controlling the magnetic domain, formed of a conductive hard magnetic material, and a magnetic sensor layer, are at least partially in direct contact with each other, and current flows in the direction wherein at least a main component of current is perpendicular to the surface of the magnetic sensor layer, and in which the current flowing in the magnetic sensor layer and the hard layer is controlled by changing the resistivity of the hard layer.

8. A magnetic head as defined in claim 7, in which the resistivity of the hard layer is controlled to not less than 80% of the highest resistivity of any of the materials constituting the magnetic sensor layer.

9. A magnetic head as defined in claim 7 or 8, in which the hard layer comprises a combination of a Co-based alloy and an insulating material of a non-solid solution.

10. A magnetic head as defined in claim 9, in which the insulating material of a non-solid solution comprises $SiO_2$.

11. A magnetic head as defined in claim 7 or 8, in which the magnetic read head is mounted in combination with a magnetic recording device.

12. A magnetic head comprising a magnetic read head mounted therein, in which the read head comprises a magnetic sensor, and the magnetic sensor has such a structure that a hard layer for controlling the magnetic domain, composed of a conductive hard magnetic material, and a magnetic sensor layer are arranged at least partially in contact with each other, and current flows in the direction wherein at least a main component of current is perpendicular to the surface of the magnetic sensor layer, and in which the hard layer has a multilayer structure comprising a Co-based alloy and an insulating material of a non-solid solution.

13. A magnetic head as defined in claim 12, in which the insulating material of a non-solid solution comprises $SiO_2$.

14. A magnetic head as defined in claim 12 or 13, in which the magnetic read head is mounted in combination with a magnetic recording device.

15. A magnetic recording apparatus which comprises, at least, a magnetic head, a magnetic recording medium, a mechanism for rotating the magnetic recording medium, an arm member for mounting the magnetic head and a mechanism for moving the magnetic head as a function of moving the arm member, in which the magnetic head comprises a magnetic sensor, and the magnetic sensor has such a structure that a hard layer for controlling the magnetic domain, formed of a conductive hard magnetic material, and a magnetic sensor layer, are at least partially in direct contact with each other, and current flows in the direction wherein at least a main component of current is perpendicular to the surface of the magnetic sensor layer, and in which the current flowing in the magnetic sensor layer and the hard layer is controlled by changing the resistivity of the hard layer.

16. A magnetic recording apparatus which comprises, at least, a magnetic head, a magnetic recording medium, a mechanism for rotating the magnetic recording medium, an arm member for mounting the magnetic head and a mechanism for moving the magnetic head as a function of moving the arm member, in which the magnetic head comprises a magnetic sensor, and the magnetic sensor has such a structure that a hard layer for controlling the magnetic domain, composed of a conductive hard magnetic material, and a magnetic sensor layer, are arranged at least partially in contact with each other, and current flows in the direction wherein at least a main component of current is perpendicular to the surface of the magnetic sensor layer, and in which the hard layer has a multilayer structure comprising a Co-based alloy and an insulating material of a non-solid solution.

* * * * *